(12) United States Patent
Kim et al.

(10) Patent No.: US 9,640,571 B2
(45) Date of Patent: May 2, 2017

(54) PIXEL ARRAYS OF IMAGE SENSORS, AND IMAGE SENSORS INCLUDING THE PIXEL ARRAYS

(71) Applicants: Seung-Sik Kim, Hwaseong-si (KR); Young-Chan Kim, Seongnam-si (KR); Eun-Sub Shim, Anyang-si (KR); Min-Seok Oh, Osan-si (KR); Ji-Won Lee, Daegu (KR); Moo-Sup Lim, Yongin-si (KR); Tae-Han Kim, Suwon-si (KR); Dong-Joo Yang, Seongnam-si (KR)

(72) Inventors: Seung-Sik Kim, Hwaseong-si (KR); Young-Chan Kim, Seongnam-si (KR); Eun-Sub Shim, Anyang-si (KR); Min-Seok Oh, Osan-si (KR); Ji-Won Lee, Daegu (KR); Moo-Sup Lim, Yongin-si (KR); Tae-Han Kim, Suwon-si (KR); Dong-Joo Yang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 14/792,862

(22) Filed: Jul. 7, 2015

(65) Prior Publication Data

US 2016/0013227 A1     Jan. 14, 2016

(30) Foreign Application Priority Data

Jul. 11, 2014  (KR) .......................... 10-2014-0087538

(51) Int. Cl.
*H01L 27/148*  (2006.01)
*H01L 27/146*  (2006.01)

(52) U.S. Cl.
CPC .. *H01L 27/14612* (2013.01); *H01L 27/14603* (2013.01); *H01L 27/14623* (2013.01); *H01L 27/14641* (2013.01)

(58) Field of Classification Search
CPC ......... H01L 27/14612; H01L 27/14623; H01L 27/14636; H01L 27/14641; H01L 27/14643
USPC ....... 257/229, 231, 233, 234, 291, 292, 294, 257/443, 448
See application file for complete search history.

(56) References Cited

U.S. PATENT DOCUMENTS

| | | | |
|---|---|---|---|
| 7,342,271 B2 * | 3/2008 | Park | ................. H01L 27/14609 257/230 |
| 7,514,716 B2 | 4/2009 | Panicacci | |
| 8,089,036 B2 | 1/2012 | Manabe | |
| 8,174,598 B2 | 5/2012 | Ebihara | |
| 8,471,938 B2 | 6/2013 | Altice, Jr. et al. | |
| 8,488,036 B2 | 7/2013 | Panicacci | |
| 2011/0211103 A1 | 9/2011 | Sakano et al. | |

(Continued)

*Primary Examiner* — Hung Vu
(74) *Attorney, Agent, or Firm* — Myers Bigel, P.A.

(57) ABSTRACT

Pixel arrays of an image sensor that include a first pixel and a second pixel adjacent the first pixel are provided. The first pixel may include a first photoelectric conversion device, a first charge storage device, a first floating diffusion node and a first transfer gate. The second pixel may include a second photoelectric conversion device, a second charge storage device, a second floating diffusion node and a second transfer gate. The pixel arrays may also include a storage gate on both the first charge storage device and the second charge storage device. The storage gate may have a unitary structure.

20 Claims, 13 Drawing Sheets

(56) References Cited

U.S. PATENT DOCUMENTS

| | | |
|---|---|---|
| 2012/0168609 A1 | 7/2012 | Krymski |
| 2012/0175498 A1 | 7/2012 | Krymski |
| 2012/0199894 A1* | 8/2012 | Furuya .............. H01L 27/14603 257/292 |
| 2012/0273854 A1 | 11/2012 | Velichko et al. |
| 2014/0008520 A1 | 1/2014 | Raynor |
| 2014/0320718 A1* | 10/2014 | Fan ................... H01L 27/14643 348/308 |

* cited by examiner

PIXEL ARRAYS OF IMAGE SENSORS, AND IMAGE SENSORS INCLUDING THE PIXEL ARRAYS

CROSS-REFERENCE TO RELATED APPLICATION

This U.S. non-provisional application claims priority under 35 U.S.C. §119 to Korean Patent Application No. 10-2014-0087538 filed on Jul. 11, 2014 in the Korean Intellectual Property Office (KIPO), the entire content of which is incorporated by reference herein in its entirety.

BACKGROUND

1. Technical Field

The inventive concept relates generally to image sensors and, more particularly, to pixel arrays of image sensors, and the image sensors including the pixel arrays.

2. Description of the Related Art

An image sensor is a semiconductor device that converts a photo image (e.g., light reflected by the subject) into an electric signal and thus is widely used in a portable electronic device, such as a digital camera, a cellular phone, etc. The image sensor may be classified into a charged coupled device (CCD) image sensor and a complementary metal oxide semiconductor (CMOS) image sensor. Recently, the CMOS image sensor has received more attention compared with the CCD image sensor because the CMOS image sensor has many advantages, such as low manufacturing costs, low power consumption, ease of integration with peripheral circuits, etc. In addition, the CMOS image sensor may be classified into a rolling shutter CMOS image sensor and a global shutter CMOS image sensor. Recently, studies on the global shutter CMOS image sensor have been done because an image distortion (e.g., motion blur, jello effect, etc.) of the global shutter CMOS image sensor is less than that of the rolling shutter CMOS image sensor.

SUMMARY

Some example embodiments provide a pixel array of an image sensor capable of improving an operation speed.

Some example embodiments provide an image sensor capable of improving an operation speed.

According to example embodiments, there is provided a pixel array of an image sensor including a first pixel and a second pixel adjacent to the first pixel. The pixel array includes a first photoelectric conversion device configured to generate first charges responding to light incident on the first pixel, a first charge storage device located adjacent to the first photoelectric conversion device, and configured to store the first charges generated by the first photoelectric conversion device, a first floating diffusion device located adjacent to the first charge storage device, a first transfer gate configured to control transferring the first charges stored in the first charge storage device to the first floating diffusion device, a second photoelectric conversion device configured to generate second charges responding to light incident on the second pixel, a second charge storage device located adjacent to the second photoelectric conversion device, and configured to store the second charges generated by the second photoelectric conversion device, a second floating diffusion device located adjacent to the second charge storage device, a second transfer gate configured to control transferring the second charges stored in the second charge storage device to the second floating diffusion device, and a storage gate on both the first charge storage device and the second charge storage device.

In some example embodiments, the pixel array may further include a storage gate control line on the storage gate, and configured to transmit a storage gate control signal to the storage gate. The storage gate may extend substantially parallel to the storage gate control line.

In some example embodiments, the second pixel may be located in a row direction from the first pixel, and the storage gate and the storage gate control line may extend in the row direction.

In some example embodiments, the second pixel may be located in a column direction from the first pixel, and the storage gate and the storage gate control line may extend in the column direction.

In some example embodiments, the pixel array may further include at least one contact connecting the storage gate control line to the storage gate.

In some example embodiments, the pixel array may further include a storage gate control line on the storage gate, and configured to transmit a storage gate control signal to the storage gate, and a light shielding layer disposed between the storage gate and the storage gate control line, and configured to block the light incident on the first charge storage device and the second charge storage device.

In some example embodiments, the pixel array may further include at least one contact connecting the storage gate control line to the storage gate.

In some example embodiments, the pixel array may further include a light shielding and storage gate control line on the storage gate, and configured to transmit a storage gate control signal to the storage gate, to block the light incident on the first charge storage device and the second charge storage device.

In some example embodiments, the light shielding and storage gate control line may be on the storage gate.

In some example embodiments, the light shielding and storage gate control line may be located at a lowest one of a plurality of wiring layers formed on a substrate of the pixel array.

In some example embodiments, the storage gate may be disposed on a front surface of a substrate of the pixel array. The pixel array may further include a storage gate control line on the storage gate, and configured to transmit a storage gate control signal to the storage gate, and a light shielding layer disposed on a back surface of the substrate of the pixel array, and configured to block the light incident on the first charge storage device and the second charge storage device.

In some example embodiments, the pixel array may further include a first reset gate transistor configured to receive a reset signal to reset the first floating diffusion device in response to a reset signal, a first source follower configured to generate a first electrical signal corresponding to the first charges of the first floating diffusion device, a first select transistor configured to transmit the first electrical signal to a first output line in response to a selection signal, a second reset gate transistor configured to receive a reset signal to reset the second floating diffusion device in response to the reset signal, a second source follower configured to generate a second electrical signal corresponding to the second charges of the second floating diffusion device, and a second select transistor configured to transmit the second electrical signal to a second output line in response to the selection signal.

In some example embodiments, the second pixel may be located in a row direction from the first pixel, the pixel array may further include a third pixel is located in a column direction from the first pixel, and the first reset gate transistor, the first source follower and the first select transistor may be shared by the first pixel and the third pixel.

In some example embodiments, the pixel array may further include a first overflow gate configured to control an overflow of the first charges generated by the first photoelectric conversion device, and a second overflow gate configured to control an overflow of the second charges generated by the second photoelectric conversion device.

According to example embodiments, there is provided a pixel array of an image sensor including a plurality of pixels arranged in a matrix having a plurality of rows and a plurality of columns. Ones of the plurality of pixels may include a photoelectric conversion device, a charge storage device, a transfer gate and a floating diffusion device. A portion of the plurality of pixels corresponding to given one of the plurality of rows includes a storage gate that comprises a unitary structure.

In some example embodiments, the photoelectric conversion devices included in respective ones of the plurality of pixels may generate charges responding to incident light during an equal integration time.

In some example embodiments, the pixel array may further include a storage gate control line on the storage gate and configured to transmit a storage gate control signal to the storage gate. The storage gate may extend substantially parallel to the storage gate control line.

In some example embodiments, the pixel array may further include a light shielding layer disposed between the integrally formed storage gate and the storage gate control line, and configured to block incident light on the charge storage device.

In some example embodiments, the pixel array may further include a light shielding and storage gate control line on the storage gate at each of the plurality of rows, and configured to transmit a storage gate control signal to the storage gate and to block incident light on the charge storage device.

According to example embodiments, there is provided an image sensor including a pixel array including a plurality of pixels arranged in a matrix having a plurality of rows and a plurality of columns, and a control unit configured to control the pixel array. Ones of the plurality of pixels include a photoelectric conversion device, a charge storage device, a transfer gate and a floating diffusion device. A portion of the plurality of pixels corresponding to given one of the plurality of rows includes a storage gate that comprises a unitary structure.

An image sensor may include a first pixel including a first photoelectric conversion device and a first charge storage device that are on a substrate and a second pixel including a second photoelectric conversion device and a second charge storage device that are on the substrate. The first charge storage device may be configured to store first charges generated in the first photoelectric conversion device, and the second charge storage device may be configured to store second charges generated in the second photoelectric conversion device. The image sensor may also include a unitary storage gate that is configured to control transferring the first charges from the first photoelectric conversion device to the first charge storage device and the second charges from the second photoelectric conversion device to the second charge storage device.

In various embodiments, the image sensor may further include a storage gate control line that is configured to transmit a storage gate control signal to the unitary storage gate and extends substantially parallel to the unitary storage gate.

According to some embodiments, the image sensor may additionally include a light shielding layer between the storage gate control line and the unitary storage gate. The light shielding layer may be on both the first charge storage device and the second charge storage device.

According to some embodiments, the image sensor may additionally include a light shielding layer on a first surface of the substrate. The unitary storage gate and the storage gate control line may be on a second surface of the substrate opposite the first surface of the substrate.

In various embodiments, the first pixel further may include a first floating diffusion device configured to receive charges from the first charge storage device, and the second pixel further may include a second floating diffusion device configured to receive charges from the second charge storage device. The first photoelectric conversion device, the first charge storage device and the first floating diffusion device are disposed along a first direction, and the second photoelectric conversion device, the second charge storage device and the second floating diffusion device are disposed along the first direction. The unitary storage gate may extend in a second direction that crosses the first direction and may extend between the first photoelectric conversion device and the first floating diffusion device and between the second photoelectric conversion device and the second floating diffusion device.

In various embodiments, the first pixel and the second pixel may be configured to read out concurrently.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
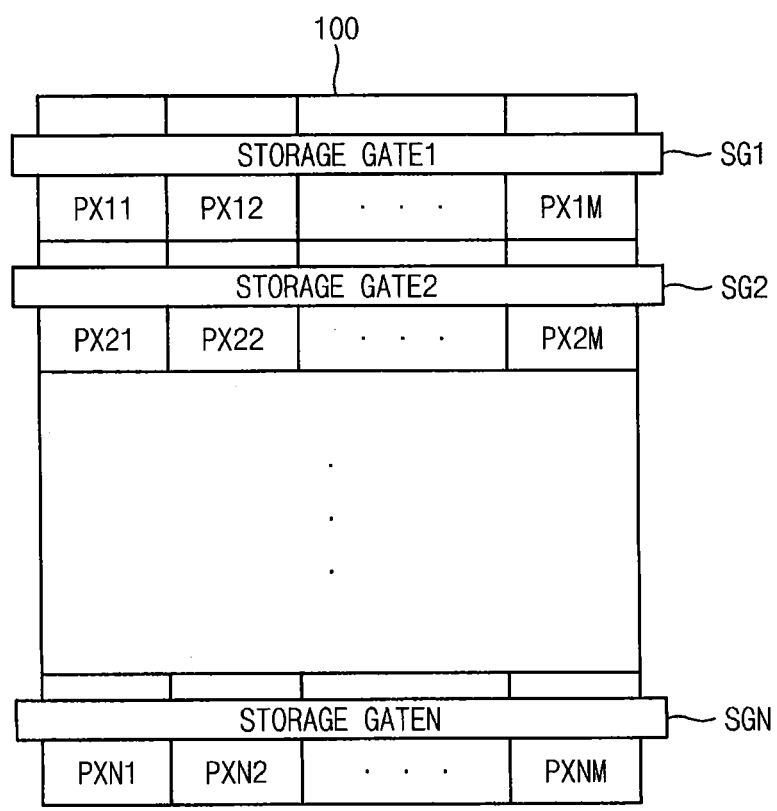
FIG. 1 is a diagram illustrating a pixel array of an image sensor according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a pixel array of an image sensor according to example embodiments.

Referring to FIG. 1, a pixel array 100 of an image sensor includes a plurality of pixels PX11, PX12, PX1M, PX21, PX22, PX2M, PXN1, PXN2 and PXNM arranged in a matrix having a plurality of rows and a plurality of columns.

In some example embodiments, the image sensor may operate in a global shutter method where the plurality of pixels PX11, PX12, PX1M, PX21, PX22, PX2M, PXN1, PXN2 and PXNM substantially simultaneously or concurrently generate charges responding to incident light during the substantially same integration time. Further, the plurality of pixels PX11, PX12, PX1M, PX21, PX22, PX2M, PXN1, PXN2 and PXNM may substantially simultaneously or concurrently store the charges generated during the same integration time in a plurality of charge storage devices respectively included in the plurality of pixels PX11, PX12, PX1M, PX21, PX22, PX2M, PXN1, PXN2 and PXNM, and electrical signals corresponding to the charges may be sequentially output based on (i.e. corresponding to) the charges stored in the charge storage devices on a row-by-row basis.

The plurality of pixels PX11, PX12, PX1M, PX21, PX22, PX2M, PXN1, PXN2 and PXNM may include a plurality of storage gates that respectively control the plurality of charge storage devices to store the charges generated during the same integration time. In the pixel array 100 according to example embodiments, one of the storage gates corresponding to at least two pixels located in the same row may be integrally formed, and may extend in parallel with a storage gate control line that transmits a storage gate control signal to the storage gates. It will be understood that the storage gate that is integrally formed may have a unitary structure. Accordingly, in some embodiments, one of the storage gates corresponding to ones of the pixels in the same row may have a unitary structure. In some embodiments, the storage gate corresponding to all pixels located in the same row may be integrally formed (e.g., may have a unitary structure). That is, with respect to each row, the pixel array 100 may include a single storage gate disposed to cover all charge storage devices of pixels located in the same row.

For example, as illustrated in FIG. 1, a single first storage gate SG1 may be disposed over the charge storage devices of the pixels PX11, PX12 and PX1M located in a first row, a single second storage gate SG2 may be disposed over the charge storage devices of the pixels PX21, PX22 and PX2M located in a second row, and a single N-th storage gate SGN may be disposed over the charge storage devices of the pixels PXN1, PXN2 and PXNM located in an N-th row, where N may be an integer that is greater than 0. As described above, the storage gate corresponding to at least two pixels located in the same row or corresponding to all pixels in the same row may be integrally formed, and may extend in parallel with the storage gate control line, thereby reducing a delay (e.g., an RC delay) of the storage gate control signal applied to the integrally formed storage gate. In other words, the storage gate corresponding to at least two pixels located in the same row may have a unitary structure.

As appreciated by the present inventors, a pixel array of an image sensor that includes multiple storage gates corresponding to respective pixels may cause an RC delay of a storage gate control signal because of a capacitance induced by the storage gates. Further, a resistance of the storage gate control line may cause an RC delay of the storage gate control signal. The pixel array 100 according to example embodiments may include one storage gate that may correspond to at least two pixels located in the same row (e.g., all pixels in the same row) and may be integrally formed. The integrally formed storage gate may extend in parallel with the storage gate control line that transmits a storage gate control signal to the integrally formed storage gate. The one storage gate that may correspond to at least two pixels located in the same row (e.g., all pixels in the same row) may have a unitary structure. Accordingly, a resistance and an RC delay of the storage gate control signal may be reduced and thus an image sensor including the pixel array 100 may operate at a higher speed.

Figure 2:
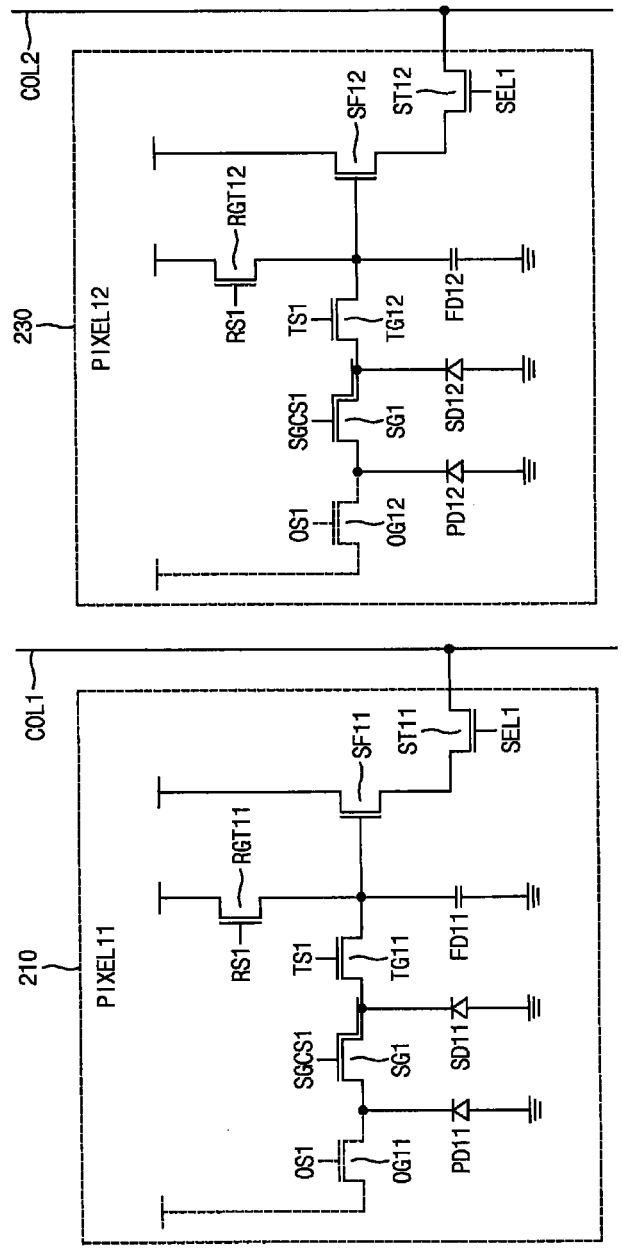
FIG. 2 is a circuit diagram illustrating adjacent pixels included in a pixel array of an image sensor according to example embodiments.

FIG. 2 is a circuit diagram illustrating adjacent pixels included in a pixel array of an image sensor according to example embodiments.

Referring to FIGS. 1 and 2, a pixel array 100 of an image sensor may include a plurality of pixels PX11, PX12, PX1M, PX21, PX22, PX2M, PXN1, PXN2 and PXNM arranged in a matrix having a plurality of rows and a plurality of columns.

Each pixel PX11, PX12, PX1M, PX21, PX22, PX2M, PXN1, PXN2 and PXNM may include a photoelectric conversion device that generates charges responding to incident light received thereby, a charge storage device that stores the charges generated by the photoelectric conversion device, a floating diffusion node located adjacent the charge storage device, and a transfer gate that transfers the charges stored in the charge storage device to the floating diffusion node. In some example embodiments, each pixel PX11, PX12, PX1M, PX21, PX22, PX2M, PXN1, PXN2 and PXNM may further include a reset gate transistor that may reset the floating diffusion node, the charge storage device and/or the photoelectric conversion device, a source follower that generates an electrical signal based on the charges of the floating diffusion node, a select transistor that transmits the electrical signal to an output line, and/or an overflow gate that reduces or possibly prevents an overflow of the charges generated by the photoelectric conversion device.

For example, as illustrated in FIG. 2, a first pixel 210 may include a first photoelectric conversion device PD11, a storage gate SG1, a first charge storage device SD11, a first transfer gate TG11, a first floating diffusion node FD11, a first reset gate transistor RGT11, a first source follower SF11 and a first select transistor ST11, and a second pixel 230 adjacent the first pixel 210 may include a second photoelectric conversion device PD12, the storage gate SG1, a second charge storage device SD12, a second transfer gate TG12, a second floating diffusion node FD12, a second reset gate transistor RGT12, a second source follower SF12 and a second select transistor ST12.

The first photoelectric conversion device PD11 may generate first charges (e.g., photo-charges) responding to light incident on the first pixel 210, and the second photoelectric conversion device PD12 may generate second charges responding to light incident on the second pixel 230. According to example embodiments, each of the first and second photoelectric conversion devices PD11 and PD12 may be a device that generates the photo-charges, for example, a photodiode (PD), a pinned photodiode (PPD), a phototransistor, a photogate, etc.

The first charge storage device SD11 may be located adjacent the first photoelectric conversion device PD11 and may store the first charges generated by the first photoelectric conversion device PD11. The second charge storage device SD12 may be located adjacent the second photoelectric conversion device PD12 and may store the second charges generated by the second photoelectric conversion device PD12. The first floating diffusion node FD11 may be located adjacent the first charge storage device SD11, and the second floating diffusion node FD12 may be located adjacent the second charge storage device SD12. The first transfer gate TG11 may control transferring the first charges stored in the first charge storage device SD11 to the first floating diffusion node FD11 in response to a transfer signal TS1, and the second transfer gate TG12 may control transferring the second charges stored in the second charge storage device SD12 to the second floating diffusion node FD12 in response to the transfer signal TS1.

The first reset gate transistor RST11 may control resetting the first floating diffusion node FD11, the first charge storage device SD11 and/or the first photoelectric conversion device PD11 in response to a reset signal RS1, and the second reset gate transistor RST12 may control resetting the second floating diffusion node FD12, the second charge storage device SD12 and/or the second photoelectric conversion device PD12 in response to the reset signal RS1. The first source follower SF11 may generate a first electrical signal by amplifying a voltage of the first floating diffusion node FD11 corresponding to the first charges of the first floating diffusion node FD11, and the second source follower SF12 may generate a second electrical signal by amplifying a voltage of the second floating diffusion node FD12 corresponding to the second charges of the second floating diffusion node FD12. The first select transistor ST11 may control transferring the first electrical signal to a first output line COL1 in response to a selection signal SEL1, and the second select transistor ST12 may control transferring the second electrical signal to a second output line COL2 in response to the selection signal SEL2.

In some example embodiments, the first pixel 210 may further include a first overflow gate OG11 to reduce or possibly prevent an overflow of the first charges generated by the first photoelectric conversion device PD11, and the second pixel 230 may further include a second overflow gate OG12 to reduce or possibly prevent an overflow of the second charges generated by the second photoelectric conversion device PD12.

The storage gate SG1 corresponding to the first pixel 210 and the second pixel 230 may control transferring the first charges generated by the first photoelectric conversion device PD11 to the first charge storage device SD11 in response to a storage gate control signal SGCS1 and may control transferring the second charges generated by the second photoelectric conversion device PD12 to the second charge storage device SD12 in response to the storage gate control signal SGCS1. The storage gate SG1 corresponding to the first pixel 210 the second pixel 230 may be integrally formed. Stated differently, the storage gate SG1 corresponding to the first pixel 210 the second pixel 230 may have a unitary structure. That is, a single storage gate SG1 may be on both of the first charge storage device SD11 and the second charge storage device SD12. For example, the second pixel 230 may be spaced apart from the first pixel 210 in a row direction, and the storage gate SG1 may extend in the row direction on both of the first and second charge storage devices SD11 and SD12. The pixel array 100 may further include a storage gate control line on the single storage gate SG1 to transmit the storage gate control signal SGCS1 to the storage gate SG1, and the storage gate control line may extend in parallel with the storage gate SG1. For example, the storage gate SG1 may extend in the row direction, and the storage gate control line may also extend in the row direction. In some example embodiments, the second pixel 230 may be spaced apart from the first pixel 210 in a column direction, and the storage gate SG1 and the storage gate control line may extend in the column direction in parallel with each other.

As described above, the storage gate corresponding to adjacent first and second pixels 210 and 230 may be the single storage gate SG1, and the storage gate SG1 may extend in parallel with the storage gate control line that transmits the storage gate control signal SGCS1, thereby reducing a resistance of the storage gate control line and the storage gate SG1. Accordingly, a delay of the storage gate control signal SGCS1 may be reduced.

Figure 3:
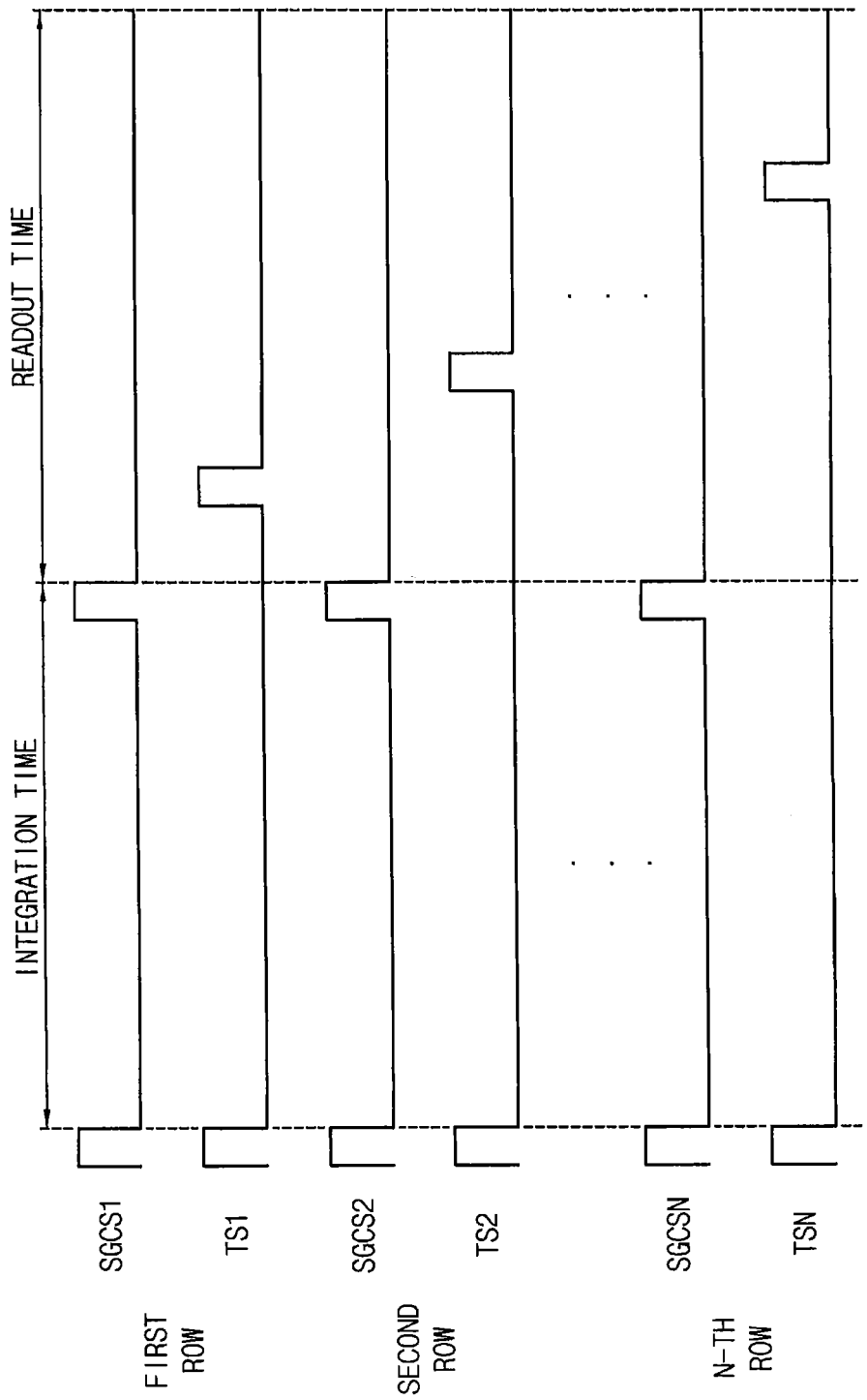
FIG. 3 is a timing diagram for describing an example of an operation of a pixel array of an image sensor according to example embodiments.

FIG. 3 is a timing diagram for describing an example of an operation of a pixel array of an image sensor according to example embodiments.

Referring to FIGS. 1 and 3, an image sensor including a pixel array 100 may operate in a global shutter method where a plurality of pixels PX11, PX12, PX1M, PX21, PX22, PX2M, PXN1, PXN2 and PXNM substantially simultaneously generate charges responding to incident light during the same integration time.

Before (e.g., immediately before) the integration time, photoelectric conversion devices, charge storage devices and/or floating diffusion nodes included in the pixels PX11, PX12, PX1M, PX21, PX22, PX2M, PXN1, PXN2 and PXNM may be reset or initialized. For example, by applying reset signals having logic high levels, transfer signals TS1, TS2 and TSN having logic high levels and storage gate control signals SGCS1, SGCS2 and SGCSN having logic high levels, the photoelectric conversion devices, the charge storage devices and/or the floating diffusion nodes may be reset.

During the integration time, the photoelectric conversion devices included in all pixels PX11, PX12, PX1M, PX21, PX22, PX2M, PXN1, PXN2 and PXNM may substantially simultaneously or concurrently generate charges (e.g., photo-charges) responding to incident light. Further, with respect to all pixels PX11, PX12, PX1M, PX21, PX22, PX2M, PXN1, PXN2 and PXNM, the charges generated during the integration time may be substantially simultaneously or concurrently transferred to the charge storage devices. For example, by applying the storage gate control signals SGCS1, SGCS2 and SGCSN having logic high levels, the charges of the photoelectric conversion devices may be substantially simultaneously or concurrently transferred to the charge storage devices.

During a readout time after the integration time, electrical signals corresponding to the charges stored in the charge storage devices may be sequentially output on a row-by-row basis. For example, as illustrated in FIG. 3, the charges stored in the charge storage devices included in the pixels PX11, PX12 and PX1M located in a first row may be transferred to floating diffusion nodes included in the pixels PX11, PX12 and PX1M in response to a first transfer signal TS1 having a logic high level. Source followers included in the pixels PX11, PX12 and PX1M may generate electrical signals by amplifying voltages of the floating diffusion nodes, and select transistors included in the pixels PX11, PX12 and PX1M may output the electrical signals through output lines (e.g., column lines). Thereafter, the charges stored in the charge storage devices included in the pixels PX21, PX22 and PX2M located in a second row may be transferred to floating diffusion nodes included in the pixels PX21, PX22 and PX2M in response to a second transfer signal TS2 having a logic high level, and electrical signals corresponding to the floating diffusion nodes may be output through the output lines. Charge transfer from the charge storage devices to the floating diffusion nodes and signal output through the output lines may be sequentially performed from the first row to the last row (e.g., an N-th row).

In some example embodiments, a readout operation during the readout time may be performed in a correlated double sampling (CDS) manner. For example, electrical signals representing reset components may be read out based on voltages of the floating diffusion nodes before the charges are transferred to the floating diffusion nodes of the pixels PX11, PX12 and PX1M, and electrical signals representing signal components may be read out based on the voltages of the floating diffusion nodes after the charges are transferred to the floating diffusion nodes of the pixels PX11, PX12 and PX1M, and effective signal components may be extracted based on differences between the electrical signals representing the reset components and the electrical signals representing the signal components. In some example embodiments, a readout operation for the electrical signals representing the reset components may be followed by or immediately followed by a readout operation for the electrical signals representing the signal components with respect to one row, and then next readout operation may be subsequently performed with respect to a next row. In some example embodiments, the readout operation for the electrical signals representing the reset components may be sequentially performed with respect to all rows, and then the readout operation for the electrical signals representing the signal components may be sequentially performed with respect to all rows.

In the pixel array 100 of the image sensor according to example embodiments, the storage gate corresponding to at least two pixels located in the same row (e.g., all pixels in the same row) may be integrally formed, and the integrally formed storage gate may extend in parallel with the storage gate control line that transmits the storage gate control signal SGCS1, SGCS2 and SGCS3 to the integrally formed storage gate. The storage gate that is integrally formed may have a unitary structure. Accordingly, the RC delay of the storage gate control signal SGCS1, SGCS2 and SGCS3 may be reduced, thereby improving the operation speed and the frame rate of the image sensor.

Figure 4:
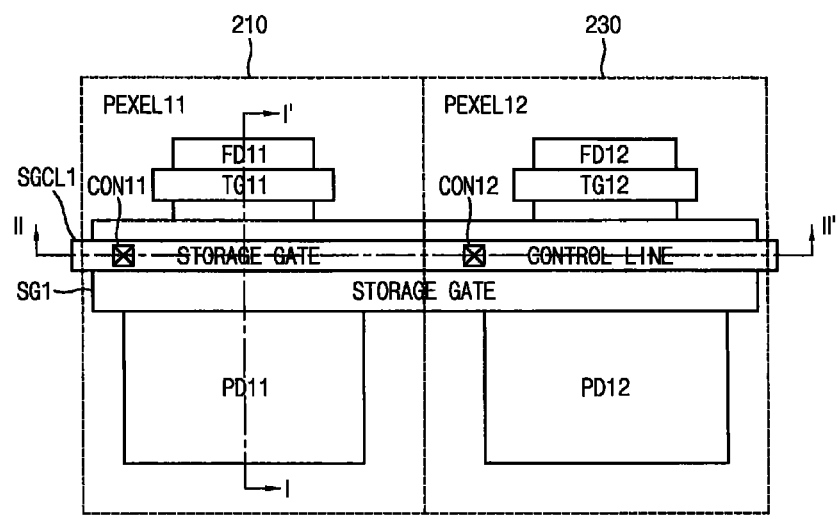
FIG. 4 is a plan view of adjacent pixels included in a pixel array of an image sensor according to example embodiments.
Figure 5:
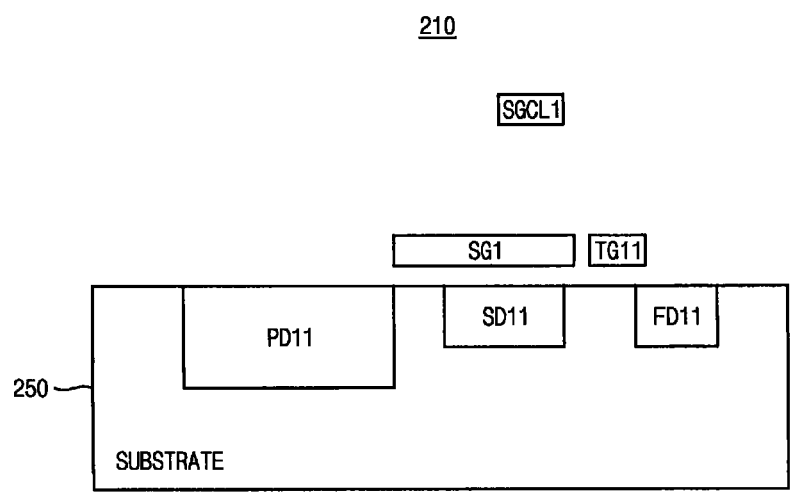
FIG. 5 is a cross-sectional view of the pixels taken along the line I-I' of FIG. 4.
Figure 6:
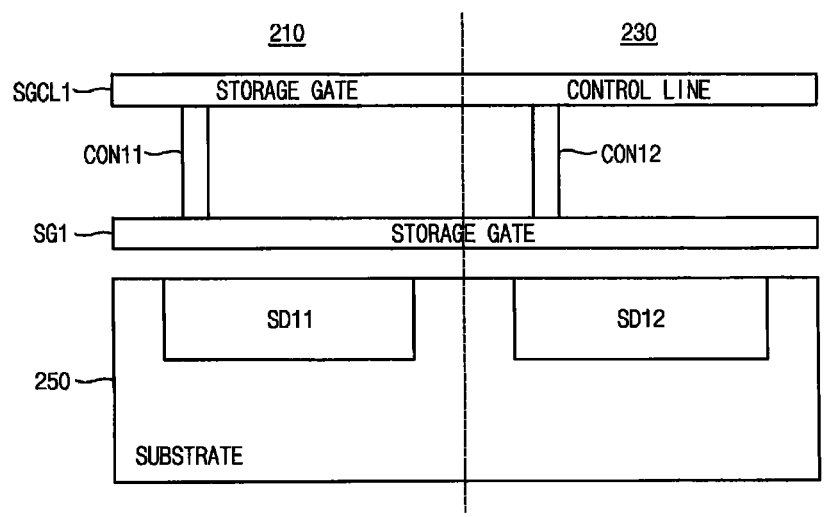
FIG. 6 is a cross-sectional view of the pixels taken along the line II-II' of FIG. 4.

FIG. 4 is a plan view of adjacent pixels included in a pixel array of an image sensor according to example embodiments, FIG. 5 is a cross-sectional view of the pixels taken along the line I-I' of FIG. 4, and FIG. 6 is a cross-sectional view of the pixels taken along the line II-IF of FIG. 4.

Referring to FIGS. 4 through 6, a first pixel 210 may include a first photoelectric conversion device PD11, a first charge storage device SD11, a first transfer gate TG11 and a first floating diffusion node FD11, and a second pixel 230 adjacent the first pixel 210 may include a second photoelectric conversion device PD12, a second charge storage device SD12, a second transfer gate TG12 and a second floating diffusion node FD12. The image sensor may include a storage gate SG1 corresponding to the first pixel 210 and the second pixel 230. In some example embodiments, each pixel 210 and 230 may further include a reset gate transistor, a source follower, a select transistor and/or an overflow transistor.

As illustrated in FIG. 5, the first photoelectric conversion device PD11 may be formed in a substrate 250 of the image sensor, the first charge storage device SD11 may be formed adjacent the first photoelectric conversion device PD11 in the substrate 250, and the first floating diffusion node FD11 may be formed adjacent the first charge storage device SD11 in the substrate 250. For example, the first photoelectric conversion device PD11 may be a pinned photodiode (PPD) including a first doped region of a second conductivity type (e.g., an N type) formed in the substrate 250 of a first conductivity type (e.g., a P type), and a second doped region of the first conductivity type formed on the first doped region in the substrate 250. In some example embodiments, the first photoelectric conversion device PD11 may be a photodiode (PD), a phototransistor, a photogate, or the like. The first charge storage device SD11 may include a third doped region of the second conductivity type formed in the substrate 250 of the first conductivity type, and the first floating diffusion node FD11 may include a fourth doped region of the second conductivity type formed in the substrate 250 of the first conductivity type. The storage gate SG1 may be formed on the first charge storage device SD11, and the first transfer gate TG11 may be formed on a portion of the substrate 250 between the first charge storage device SD11 and the first floating diffusion node FD11. For example, the storage gate SG1 and the first transfer gate TG11 may include polysilicon. The second pixel 230 may be formed similarly to the first pixel 210 illustrated in FIG. 5.

As illustrated in FIGS. 4 and 6, the storage gate SG1 of the first pixel 210 and the storage gate SG1 of the second pixel 230 may be integrally formed. That is, the single storage gate SG1 that has a unitary structure may be formed on both the first and second charge storage devices SD11 and SD12 to cover both of the first and second charge storage devices SD11 and SD12 of the first and second pixels 210 and 230 that are adjacent each other in a first direction (e.g., a row direction). Further, a storage gate control line SGCL1 that transmits a storage gate control signal to the integrally formed storage gate SG1 may be formed on the integrally formed storage gate SG1. For example, the storage gate control line SGCL1 may include a metal material, such as copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), an alloy thereof, etc. Further, between the storage gate control line SGCL1 and the storage gate SG1, at least one contact CON11 and CON12 may be formed to connecting the storage gate control line SGCL1 to the storage gate SG1. For example, a first contact CON11 connecting the storage gate control line SGCL1 to the storage gate SG1 may be formed at the first pixel 210, and a second contact CON12 connecting the storage gate control line SGCL1 to the storage gate SG1 may be formed at the second pixel 230. In some example embodiments, one contact may be formed per two or more pixels, or two or more contact may be formed at each pixel.

As illustrated in FIGS. 4 and 6, the storage gate SG1 may extend in parallel with the storage gate control line SGCL1. For example, the storage gate SG1 may be an integrally formed storage gate corresponding to the pixels 210 and 230 that are adjacent in a row direction, and thus the storage gate SG1 may extend in the row direction. The storage gate SG1 that is integrally formed may have a unitary structure. Further, the storage gate control line SGCL1 may also extend in the row direction to apply the storage gate control signal on a row-by-row basis. The storage gate SG1 and the storage gate control line SGCL1 may extend in the row direction in parallel with each other. In the pixel array according to example embodiments, the integrally formed storage gate SG1 and the storage gate control line SGCL1 may extend in parallel with each other, and thus a resistance of the storage gate control line SGCL1 may be reduced by the storage gate SG1 that is connected in parallel with the storage gate control line SGCL1. Accordingly, an RC delay of the storage gate control signal may be reduced.

Although FIGS. 4 through 6 illustrate the storage gate SG1 corresponding to two pixels 210 and 230, according to example embodiments, a storage gate may correspond three or more pixels that are adjacent in the row direction. For example, a storage gate corresponding to all pixels in the same row may be integrally formed. Stated differently, a storage gate corresponding to three or more pixels (e.g., all pixels) in the same row may be a unitary storage gate. Thus, the RC delay of the storage gate control signal applied to the storage gate may be reduced, thereby improving the operation speed and the frame rate of the image sensor.

Figure 7:
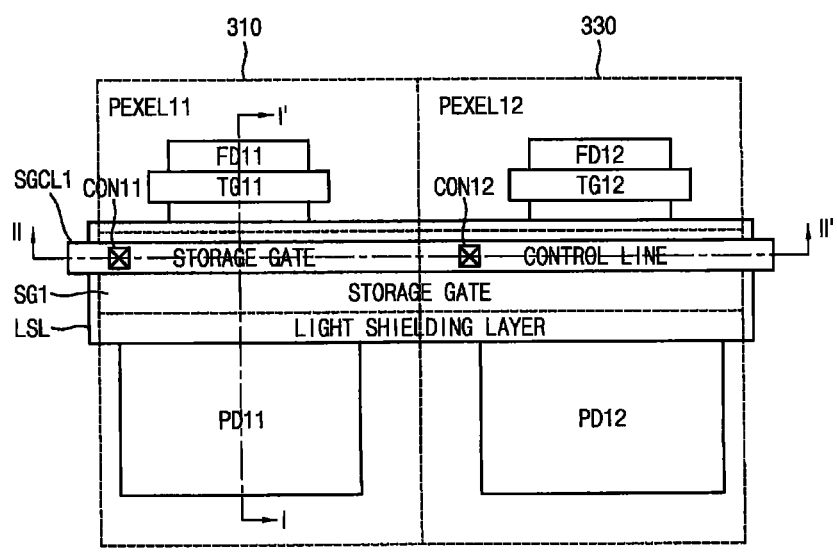
FIG. 7 is a plan view of adjacent pixels included in a pixel array of an image sensor according to example embodiments.
Figure 8:
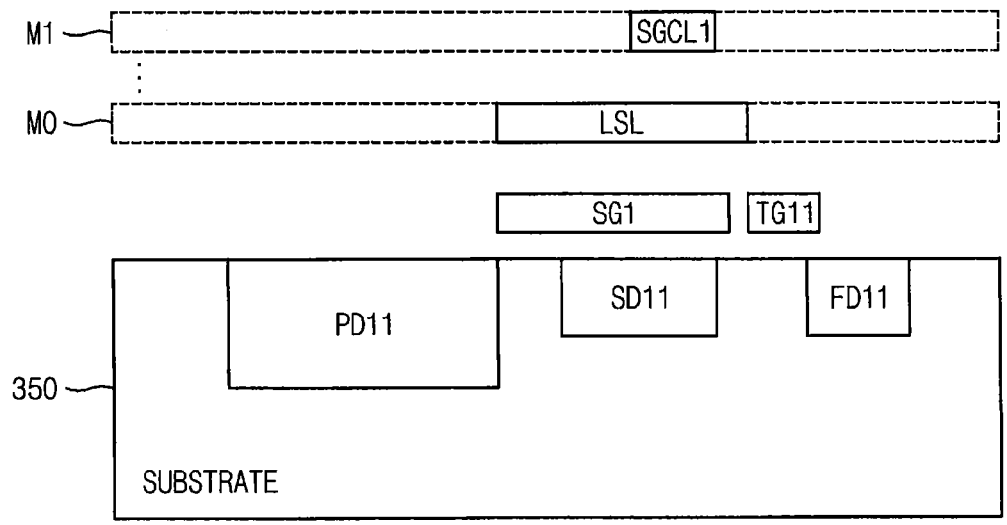
FIG. 8 is a cross-sectional view of the pixels taken along the line I-I' of FIG. 7.
Figure 9:
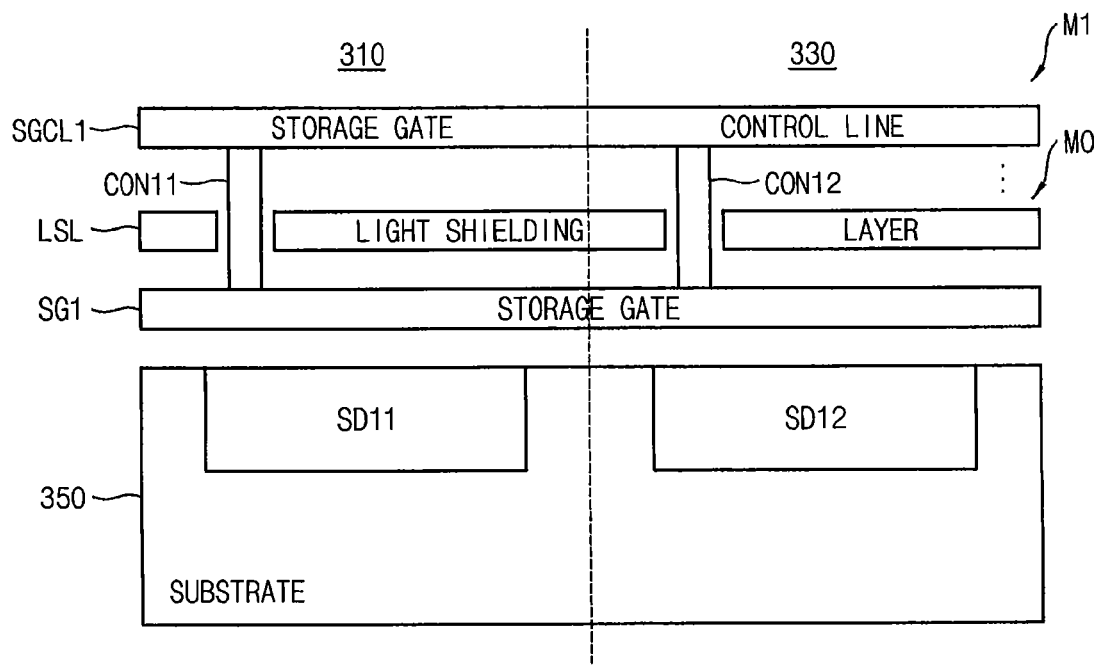
FIG. 9 is a cross-sectional view of the pixels taken along the line II-IF of FIG. 7.

FIG. 7 is a plan view of adjacent pixels included in a pixel array of an image sensor according to example embodiments, FIG. 8 is a cross-sectional view of the pixels taken along the line I-I' of FIG. 7, and FIG. 9 is a cross-sectional view of the pixels taken along the line II-II' of FIG. 7.

Referring to FIGS. 7 through 9, a first pixel 310 may include a first photoelectric conversion device PD11, a first charge storage device SD11, a first transfer gate TG11 and a first floating diffusion node FD11, and a second pixel 330 adjacent the first pixel 310 may include a second photoelectric conversion device PD12, a second charge storage device SD12, a second transfer gate TG12 and a second floating diffusion node FD12. The image sensor may include a storage gate SG1 corresponding to the first pixel 310 and the second pixel 330. A pixel array including the first and second pixels 310 and 330 illustrated in FIGS. 7 through 9 may have a similar configuration to the pixel array including first and second pixels 210 and 230 illustrated in FIGS. 4 through 6, except that a light shielding layer LSL is further included between the storage gate SG1 and a storage gate control line SGCL1.

The light shielding layer LSL may be disposed between the storage gate SG1 and the storage gate control line SGCL1 to block light incident on the first and second charge storage device SD11 and SD12. For example, the light shielding layer LSL may include a metal material, such as tungsten (W), may be formed on the first and second charge storage devices SD11 and SD12. In some embodiments, the light shielding layer LSL may entirely cover the first and second charge storage devices SD11 and SD12. The light shielding layer LSL may reflect incident light and may thus block light incident on the first charge storage device SD11 and the second charge storage device SD12. Accordingly, only charges generated by the first photoelectric conversion device PD11 may be stored in the first charge storage device SD11, and photo-charges responding to incident light may not be generated at the first charge storage device SD11. Further, only charges generated by the second photoelectric conversion device PD12 may be stored in the second charge storage device SD12, and photo-charges responding to incident light may not be generated at the second charge storage device SD12. For examples, the light shielding layer LSL may include a metal material, such as copper (Cu), aluminum (Al), titanium (Ti), molybdenum (Mo), tantalum (Ta), titanium nitride (TiN), tantalum nitride (TaN), zirconium nitride (ZrN), tungsten nitride (WN), an alloy thereof, etc.

The light shielding layer LSL and the storage gate control line SGCL1 may be portions of M0 and M1 of a plurality of wiring layers (e.g., a multi-metal layer) formed on a substrate 350 of the pixel array. For example, the light shielding layer LSL may be a portion of a first wiring layer M0, and the storage gate control line SGCL1 may be a portion of the second wiring layer M1 on the first wiring layer M0. In some example embodiments, the first wiring layer M0 including the light shielding layer LSL may be a lowest one of the plurality of wiring layers, so that light incident on the first and second charge storage devices SD11 and SD12 may be efficiently blocked. In some example embodiments, at least one wiring layer may be further formed between the first wiring layer M0 and the second wiring layer M1.

As illustrated in FIGS. 7 and 9, the storage gate SG1 and the storage gate control line SGCL1 may extend in a row direction in parallel with each other. In the pixel array according to example embodiments, the integrally formed storage gate SG1 that has a unitary structure and the storage gate control line SGCL1 may extend in parallel with each other, and thus a resistance of the storage gate control line SGCL1 may be reduced by the storage gate SG1 that is connected in parallel with the storage gate control line SGCL1. Accordingly, an RC delay of the storage gate control signal may be reduced.

Figure 10:
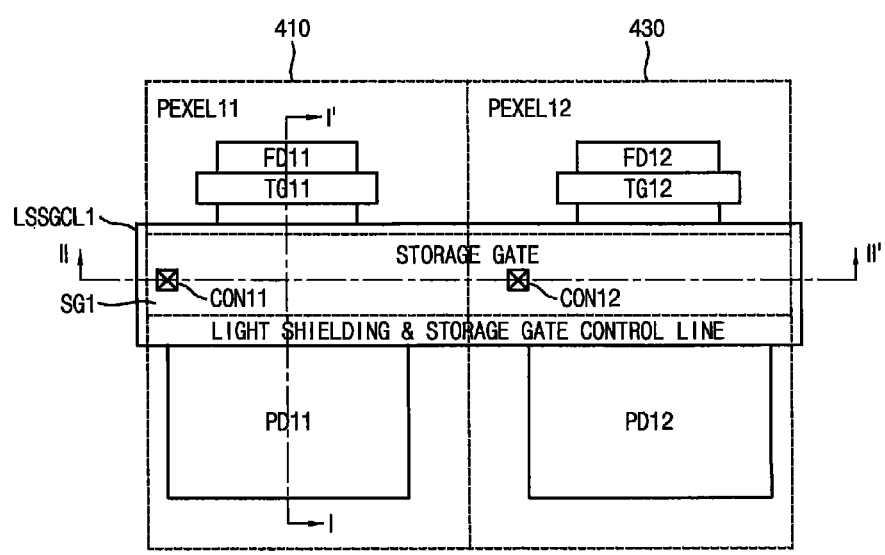
FIG. 10 is a plan view of adjacent pixels included in a pixel array of an image sensor according to example embodiments.
Figure 11:
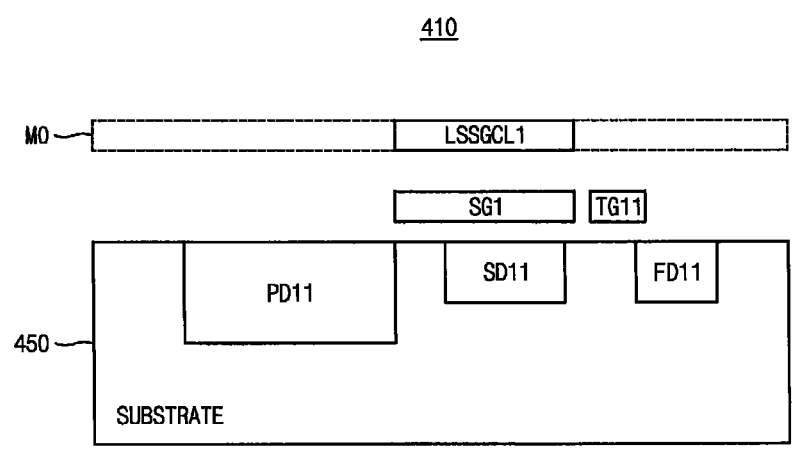
FIG. 11 is a cross-sectional view of the pixels taken along the line I-I' of FIG. 10.
Figure 12:
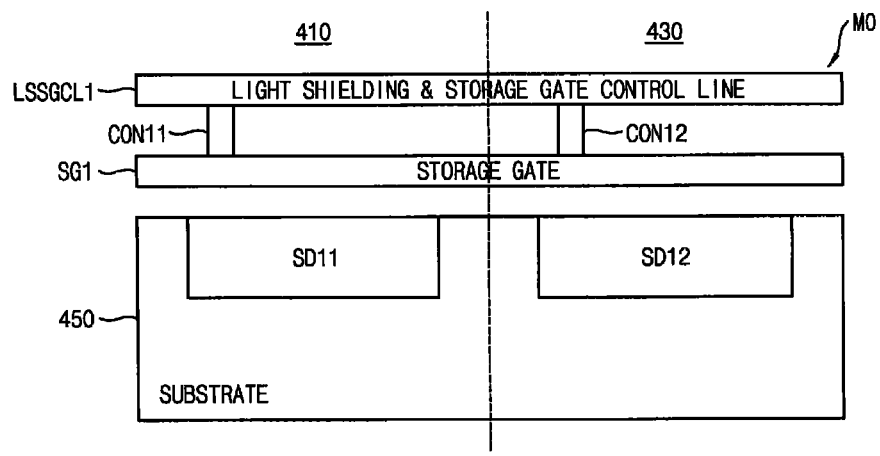
FIG. 12 is a cross-sectional view of the pixels taken along the line II-II' of FIG. 10.

FIG. 10 is a plan view of adjacent pixels included in a pixel array of an image sensor according to example embodiments, FIG. 11 is a cross-sectional view of the pixels taken along the line I-I' of FIG. 10, and FIG. 12 is a cross-sectional view of the pixels taken along the line II-II' of FIG. 10.

Referring to FIGS. 10 through 12, a first pixel 410 may include a first photoelectric conversion device PD11, a first charge storage device SD11, a first transfer gate TG11 and a first floating diffusion node FD11, and a second pixel 430 adjacent to the first pixel 410 may include a second photoelectric conversion device PD12, a second charge storage device SD12, a second transfer gate TG12 and a second floating diffusion node FD12. A pixel array including the first and second pixels 410 and 430 illustrated in FIGS. 10 through 12 may have a similar configuration to the pixel array including first and second pixels 310 and 330 illustrated in FIGS. 7 through 9, except that a light shielding layer LSL and a storage gate control line SGCL1 illustrated in FIGS. 7 through 9 are integrally formed as a single (i.e., unitary) line, or a light shielding and storage gate control line LSSGCL1.

The light shielding and storage gate control line LSSGCL1 may serve as both of a storage gate control line that transfers a storage gate control signal to the storage gate SG1 and a light shielding layer that prevents incident light from reaching the charge storage devices SD11 and SD12. In some example embodiments, the light shielding and storage gate control line LSSGCL1 may be formed at each row of the pixel array.

The light shielding and storage gate control line LSSGCL1 may be formed over the storage gate SG1. The storage gate control signal applied to the light shielding and storage gate control line LSSGCL1 may be transferred to the storage gate SG1 via at least one contact CON11 and CON12. The light shielding and storage gate control line LSSGCL1 may be formed to cover the storage gate SG1, or to cover the entire surfaces of the first and second charge storage devices SD11 and SD12 to prevent the incident light from reaching the first and second charge storage devices SD11 and SD12. Thus, by reflecting light at the light shielding and storage gate control line LSSGCL1, the light shielding and storage gate control line LSSGCL1 may prevent light incident on the first pixel 410 from reaching the first charge storage device SD11, and may prevent light incident on the second pixel 430 from reaching the second charge storage device SD12. For example, the light shielding and storage gate control line LSSGCL1 may be formed from a metal material, such as tungsten (W), copper (Cu), aluminum (Al), titanium (Ti), molybdenum (Mo), tantalum (Ta), titanium nitride (TiN), tantalum nitride (TaN), zirconium nitride (ZrN), tungsten nitride (WN), an alloy thereof, etc.

In some example embodiments, to efficiently prevent the incident light from reaching the first and second charge storage devices SD11 and SD12, the light shielding and storage gate control line LSSGCL1 may be formed at a lowest one of a plurality of wiring layers formed on a substrate 450 of the pixel array.

As illustrated in FIGS. 10 and 12, the storage gate SG1 and the light shielding and storage gate control line LSSGCL1 may extend in a row direction in parallel with each other. In the pixel array according to example embodiments, the integrally formed storage gate SG1 that has a unitary structure and the light shielding and storage gate control line LSSGCL1 may extend in parallel with each other, and thus a resistance of the light shielding and storage gate control line LSSGCL1 may be reduced by the storage gate SG1 that is connected in parallel with the light shielding and storage gate control line LSSGCL1. Accordingly, an RC delay of the storage gate control signal may be reduced.

Figure 13:
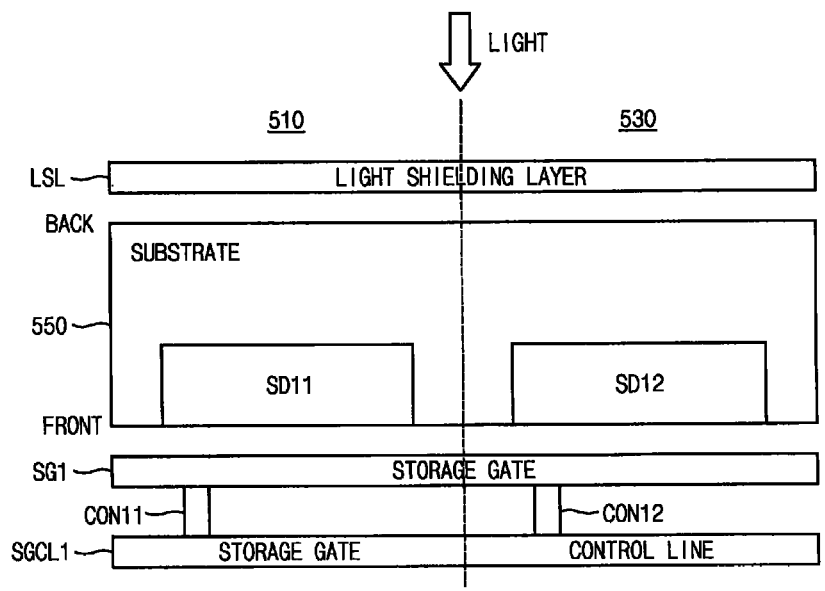
FIG. 13 is a cross-sectional view of adjacent pixels included in a pixel array of an image sensor according to example embodiments.

FIG. 13 is a cross-sectional view of adjacent pixels included in a pixel array of an image sensor according to example embodiments.

Referring to FIG. 13, a pixel array including a first pixel 510 and a second pixel 530 may be a backside illumination (BSI) type pixel array. The pixel array including the first and second pixels 510 and 530 illustrated in FIG. 13 may have a similar configuration to the pixel array including first and second pixels 310 and 330 illustrated in FIGS. 7 through 9, except that the pixel array is the backside illumination (BSI) type pixel array where a light shielding layer LSL is formed on a back surface BACK of a substrate 550 of the pixel array.

A storage gate SG1 may be disposed on a front surface FRONT of the substrate 550 of the pixel array, a storage gate control line SGCL1 that transmits a storage gate control signal to the storage gate SG1 may be disposed over the storage gate SG1. The light shielding layer LSL may be disposed on the back surface BACK of the substrate 550 of the pixel array to block light incident on the first charge storage device SD11 of the first pixel 510 and the second charge storage device SD12 of the second pixel 530.

As illustrated in FIG. 13, the storage gate SG1 and the storage gate control line SGCL1 may extend in a row direction in parallel with each other. In the pixel array according to example embodiments, the integrally formed storage gate SG1 and the storage gate control line SGCL1 may extend in parallel with each other, and thus a resistance of the storage gate control line SGCL1 may be reduced by the storage gate SG1 that is connected in parallel with the storage gate control line SGCL1. Accordingly, an RC delay of the storage gate control signal may be reduced.

Figure 14:
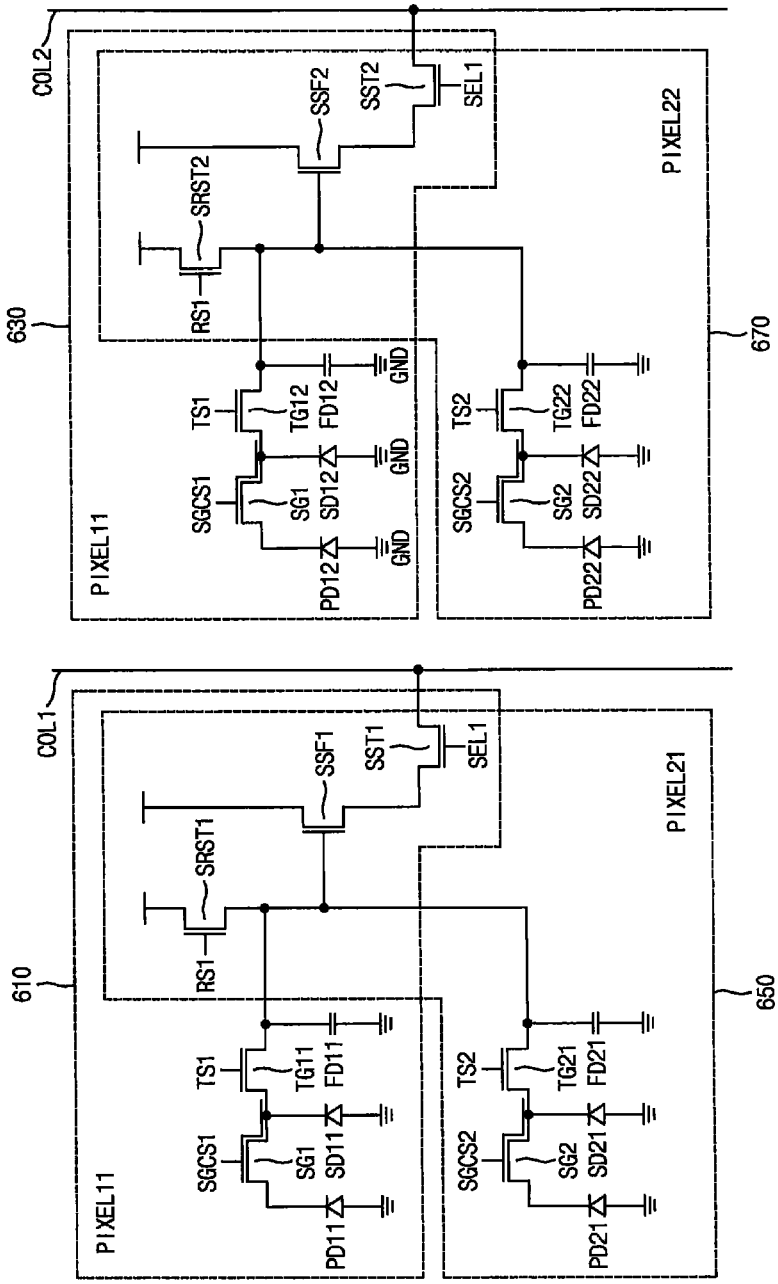
FIG. 14 is a circuit diagram illustrating adjacent pixels included in a pixel array of an image sensor according to example embodiments.

FIG. 14 is a circuit diagram illustrating adjacent pixels included in a pixel array of an image sensor according to example embodiments.

Referring to FIG. 14, a first pixel 610 may include a first photoelectric conversion device PD11, a first storage gate SG1 to which a first storage gate control signal SGCS1 is applied, a first charge storage device SD11, a first transfer gate TG11 to which a first transfer signal TS1 is applied, a first floating diffusion node FD11, a first reset gate transistor SRST1 to which a first reset signal RS1 is applied, a first source follower SSF1 and a first select transistor SST1 to which a first selection signal SEL1 is applied. A second pixel 630 located in a row direction from the first pixel 610 may include a second photoelectric conversion device PD12, the first storage gate SG1 to which a first storage gate control signal SGCS1 is applied, a second charge storage device SD12, a second transfer gate TG12 to which the first transfer signal TS1 is applied, a second floating diffusion node FD12, a second reset gate transistor SRST2 to which the first reset signal RS1 is applied, a second source follower SSF2 and a second select transistor SST2 to which the first selection signal SEL1 is applied.

A third pixel 650 located in a column direction from the first pixel 610 may include a third photoelectric conversion device PD21, a second storage gate SG2 to which a second storage gate control signal SGCS2 is applied, a third charge storage device SD21, a third transfer gate TG21 to which a second transfer signal TS2 is applied, a third floating diffusion node FD21, the first reset gate transistor SRST1, the first source follower SSF1 and the first select transistor SST1. A fourth pixel 670 located in the row direction from the third pixel 650 may include a fourth photoelectric conversion device PD22, the second storage gate SG2 to which the second storage gate control signal SGCS2 is applied, a fourth charge storage device SD22, a fourth transfer gate TG22 to which the second transfer signal TS2 is applied, a fourth floating diffusion node FD22, the second reset gate transistor SRST2, the second source follower SSF2 and the second select transistor SST2.

As illustrated in FIG. 14, the first reset gate transistor SRST1, the first source follower SSF1 and the first select transistor SST1 may be shared by the first pixel 610 and the third pixel 650, and the second reset gate transistor SRST2, the second source follower SSF2 and the second select transistor SST2 may be shared by the second pixel 630 and the fourth pixel 670. Accordingly, a number of transistors at each pixel may be reduced, and a fill factor of each pixel may be improved. Although FIG. 14 illustrates an example where a reset gate transistor, a source follower and a select transistor are shared by two adjacent pixels, according to some example embodiments, at least one transistor of the reset gate transistors and select transistors may be shared by three or more pixels.

The first storage gate SG1 included in the first pixel 610 and the first storage gate SG1 included in the second pixel 630 located in the row direction from the first pixel 610 may be integrally formed, and the second storage gate SG2 included in the third pixel 650 and the second storage gate SG2 included in the fourth pixel 670 located in the row direction from the third pixel 650 may be integrally formed. Stated differently, each of the first storage gate SG1 and the second storage gate SG2 may have a unitary structure. That is, the single first storage gate SG1 may correspond to and be formed on both of the first and second charge storage devices SD11 and SD12, and the single second storage gate SG2 may correspond to and be formed on both of the third and fourth charge storage devices SD21 and SD22. Further, the first storage gate SG1 may extend in parallel with a first storage gate control line that transmits the first storage gate control signal SGCS1 to the first storage gate SG1, and the second storage gate SG2 may extend in parallel with a second storage gate control line that transmits the second storage gate control signal SGCS2 to the second storage gate SG2. Accordingly, RC delays of the first and second storage gate control signals SGCS1 and SGCS2 may be reduced.

Figure 15:
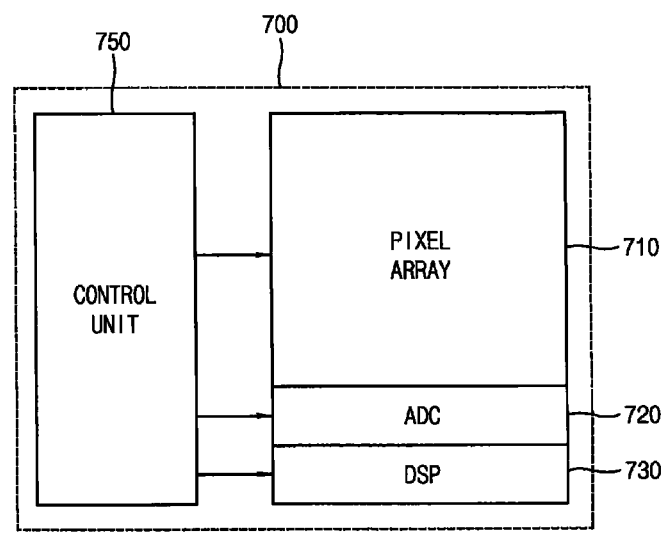
FIG. 15 is a block diagram illustrating an image sensor according to example embodiments.
Figure 16:
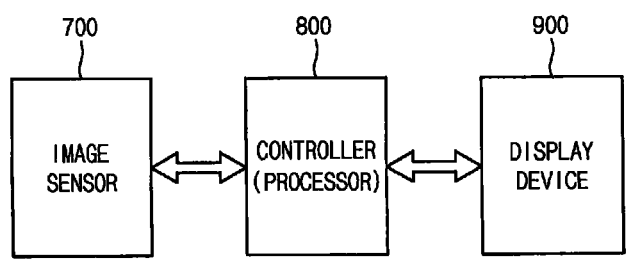
FIG. 16 is a block diagram illustrating an example in which the image sensor of FIG. 15 is connected to a display device via a controller.

FIG. 15 is a block diagram illustrating an image sensor according to example embodiments, and FIG. 16 is a block diagram illustrating an example in which the image sensor of FIG. 15 is connected to a display device via a controller.

Referring to FIG. 15, an image sensor 700 may include a pixel array 710 and a control unit 750. In some example embodiments, the image sensor 700 may further include an analog-to-digital conversion (ADC) unit 720 and a digital signal processing (DSP) unit 730.

The pixel array 710 may include a plurality of pixels arranged in a matrix having a plurality of rows and a plurality of columns. Each pixel may include a photoelectric conversion device, a charge storage device, a transfer gate and a floating diffusion node. The pixel array 710 may include a storage gate corresponding to at least two of the plurality of pixels that are located in the same row, and the storage gate may be integrally formed. In other words, the storage gate may have a unitary structure. Further, the integrally formed storage gate may be disposed in parallel with a storage gate control line that transmits a storage gate control signal to the storage gate. Accordingly, an RC delay of the storage gate control signal may be reduced, and an operation speed and a frame rate of the image sensor 700 may be improved.

The ADC unit 720 may convert an analog signal output from the pixel array 710 into a digital signal. According to example embodiments, the ADC unit 720 may perform a column ADC that converts the analog signals in parallel by using a plurality of analog-to-digital converters respectively coupled to a plurality of column lines of the pixel array 710, or may perform a single ADC that sequentially converts the analog signals by using a single analog-to-digital converter.

In some example embodiments, the ADC unit 720 may include a correlated double sampling (CDS) unit for extracting an effective signal component. In some example embodiments, the CDS unit may perform an analog double sampling that extracts the effective signal component based on a difference between an analog reset signal including a reset component and an analog data signal including a signal component. In some example embodiments, the CDS unit may perform a digital double sampling that converts the analog reset signal and the analog data signal into two digital signals and extracts the effective signal component based on a difference between the two digital signals. In some example embodiments, the CDS unit may perform a dual correlated double sampling that performs both the analog double sampling and the digital double sampling.

The DSP unit 730 may receive a digital image signal output from the ADC unit 720, and may perform image data processing on the digital image signal. For example, the DSP unit 730 may perform image interpolation, color correction, white balance, gamma correction, color conversion, etc. As illustrated in FIG. 16, the image sensor 700 may be connected to a display device 900 via a controller (or processor) 800. Thus, the display device 900 may display an image based on the image signal output from the DSP unit 730. Although it is illustrated in FIG. 15 that the DSP unit 730 is located inside the image sensor 700, the DSP unit 730 may be located outside the image sensor 700. For example, the DSP unit 730 may be implemented inside the controller 800 or may be implemented independently (or separately) from the image sensor 700 and the controller 800.

The control unit 750 may control the pixel array 710, the ADC unit 720 and the DSP unit 730. The control unit 750 may provide the pixel array 710, the ADC unit 720 and the DSP unit 730 with control signals, such as a clock signal, a timing control signal, or the like. In some example embodiments, the control unit 750 may include a control logic circuit, a phase locked loop (PLL) circuit, a timing control circuit, a communication interface circuit, or the like.

Although not illustrated in FIG. 15, the image sensor 700 may further include a row decoder that selects a row of the pixel array 710, and a row driver that activates the selected row. In some example embodiments, the image sensor 700 may further include a column decoder that selects one of a plurality of analog-to-digital converters included in the ADC unit 720, and a column driver that provides an output of the selected analog-to-digital converter to the DSP unit 730 or an external host (e.g., the controller 800).

Figure 17:
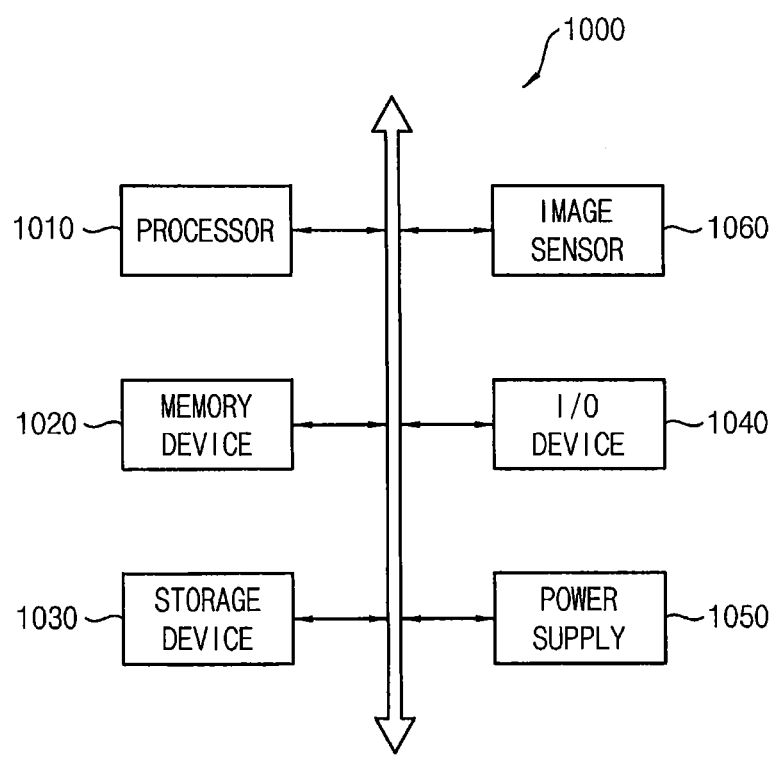
FIG. 17 is a block diagram illustrating an electronic device according to example embodiments.
Figure 18A:
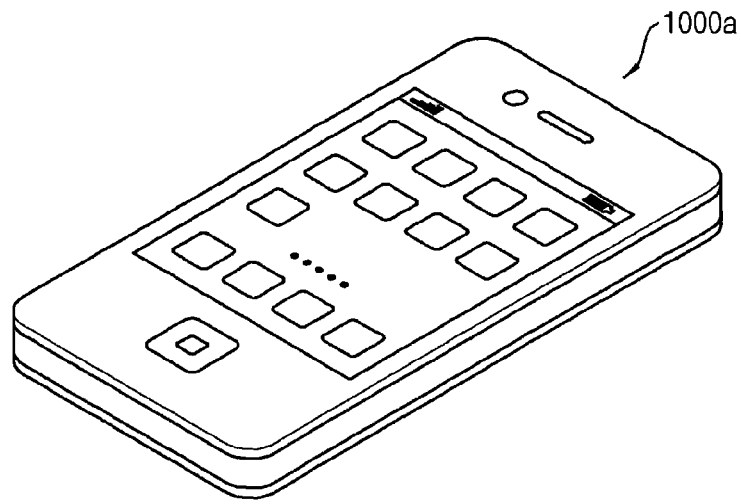
FIG. 18A is a diagram illustrating an example electronic device in which the electronic device of FIG. 17 is implemented.
Figure 18B:
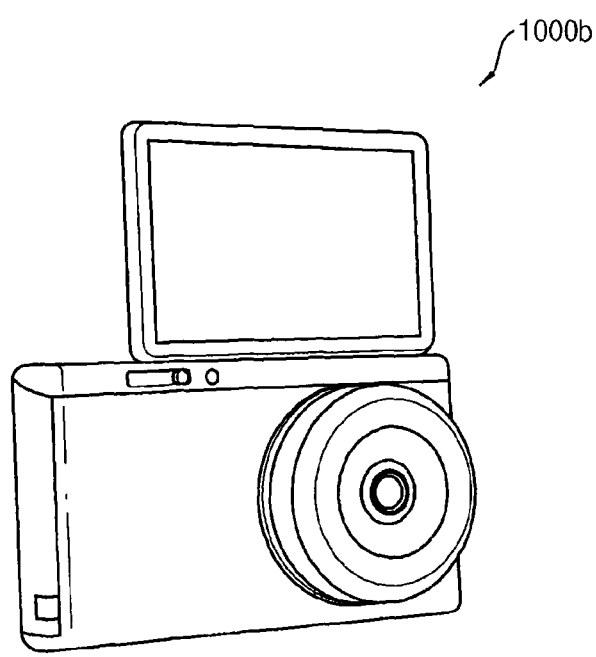
FIG. 18B is a diagram illustrating an example electronic device in which the electronic device of FIG. 17 is implemented.

FIG. 17 is a block diagram illustrating an electronic device according to example embodiments, FIG. 18A is a diagram illustrating an example electronic device in which the electronic device of FIG. 17 is implemented, and FIG. 18B is a diagram illustrating an example electronic device in which the electronic device of FIG. 17 is implemented.

Referring to FIGS. 17, 18A and 18B, an electronic device 1000 may include a processor 1010, a memory device 1020, a storage device 1030, an input/output (I/O) device 1040, a power supply 1050, and an image sensor 1060. In some example embodiments, the electronic device 1000 may further include a plurality of ports for communicating a video card, a sound card, a memory card, a universal serial bus (USB) device, other electronic devices, etc. In some example embodiments, as illustrated in FIG. 18A, the electronic device 1000 may be a smart phone 1000a. In some example embodiments, as illustrated in FIG. 18B, the electronic device 1000 may be digital camera 1000b. Here, the electronic device 1000 including a global shutter image sensor 1060 may reduce or possibly prevent an image distortion (e.g., motion blur, jello effect, etc) when performing an image capturing (e.g., still image shooting, moving image shooting, etc). Further, the electronic device 1000 including the global shutter image sensor 1060 may provide a high performance (or high speed) continuous shooting function to users.

The processor 1010 may perform various computing functions. The processor 1010 may be, for example, a micro-processor, a central processing unit (CPU), an application processor (AP), etc. The processor 1010 may be coupled to the memory device 1020, the storage device 1030, and the I/O device 1040 via an address bus, a control bus, a data bus, etc. In some example embodiments, the processor 1010 may be coupled to an extended bus such as a peripheral component interconnection (PCI) bus. The memory device 1020 may store data for operations of the electronic device 1000. For example, the memory device 1020 may include a volatile semiconductor memory device such as a dynamic random access memory (DRAM) device, a static random access memory (SRAM) device, a mobile DRAM, etc, and a non-volatile semiconductor memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. The storage device 1030 may include a solid state drive (SSD) device, a hard disk drive (HDD) device, a CD-ROM device, etc.

The I/O device 1040 may include an input device such as a keyboard, a keypad, a touchpad, a touch-screen, a mouse device, etc, and an output device such as a display device, a printer, a speaker, etc. The power supply 1050 may supply power to the electronic device 1000. The image sensor 1060 may be coupled to other components via the buses or other communication links. As described above, in the image sensor 1060, each of storage gates of corresponding to at least two pixels located in the same row (e.g., all pixels in the same row) may be integrally formed, and may extend in parallel with a storage gate control line that transmits a storage gate control signal to the storage gates, thereby reducing a delay (e.g., an RC delay) of the storage gate control signal applied to the integrally formed storage gate. In other words, each of storage gates corresponding to at least two pixels located in the same row may have a unitary structure. Accordingly, an operation speed and a frame rate of the image sensor 1060 may be improved.

In some example embodiments, the image sensor 1060 may be implemented by various packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat-Pack (TQFP), Small Outline Integrated Circuit (SOIC), Shrink Small Outline Package (SSOP), Thin Small Outline Package (TSOP), Thin Quad Flat-Pack (TQFP), System In Package (SIP), Multi Chip Package (MCP), Wafer-level Fabricated Package (WFP), Wafer-Level Processed Stack Package (WSP). As described above, the electronic device 1000 including the image sensor 1060 may output a high-quality image. In some example embodiments, the image sensor 1060 and the processor 1010 may be integrated in one chip. In some example embodiments, the image sensor 1060 and the processor 1010 may be integrated in different chips, respectively. Although it is illustrated in FIGS. 18A and 18B that the electronic device 1000 is the smart phone 1000a or the digital camera 1000b (e.g., a mirror-less digital camera, etc), the electronic device 1000 is not limited thereto. That is, it should be understood that the electronic device 1000 can be any electronic device including (or using) the image sensor 1060. For example, the electronic device 1000 may be implemented as a cellular phone, a smart pad, a personal digital assistants (PDA), a portable multimedia player (PMP), etc.

Figure 19:
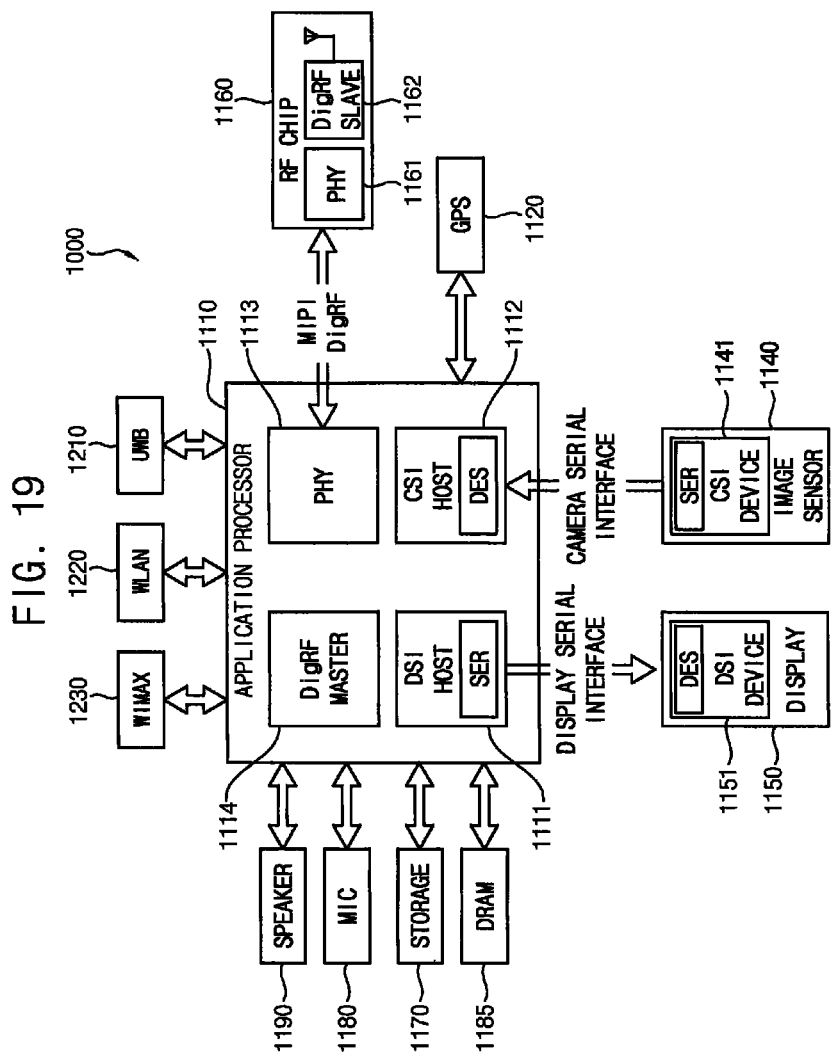
FIG. 19 is a block diagram illustrating an example of an interface that is used in the electronic device of FIG. 17.

FIG. 19 is a block diagram illustrating an example of an interface that is used in the electronic device 1000 of FIG. 17.

Referring to FIG. 19, the electronic device 1000 may be implemented by a data processing device that uses or supports a mobile industry processor interface (MIPI) interface (e.g., a mobile phone, a personal digital assistant (PDA), a portable multimedia player (PMP), a smart phone, etc). The electronic device 1000 may include an application processor 1110, an image sensor 1140, a display device 1150, and other various input/output devices discussed in detail below. A CSI host 1112 of the application processor 1110 may perform a serial communication with a CSI device 1141 of the image sensor 1140 using a camera serial interface (CSI). In example embodiments, the CSI host 1112 may include a light deserializer (DES), and the CSI device 1141 may include a light serializer (SER). A DSI host 1111 of the application processor 1110 may perform a serial communication with a DSI device 1151 of the display device 1150 using a display serial interface (DSI). In example embodiments, the DSI host 1111 may include a light serializer (SER), and the DSI device 1151 may include a light deserializer (DES). The electronic device 1000 may further include a radio frequency (RF) chip 1160. The RF chip 1160 may perform a communication with the application processor 1110. A physical layer (PHY) 1113 of the portable electronic device 1000 and a physical layer (PHY) 1161 of the RF chip 1160 may perform data communications based on a MIPI DigRF. The application processor 1110 may further include a DigRF MASTER 1114 that controls the data communications of the PHY 1161. The electronic device 1000 may include a global positioning system (GPS) 1120, a storage 1170, a MIC 1180, a DRAM device 1185, and a speaker 1190. The portable electronic device 1000 may perform communications using an ultra wideband (UWB) 1210, a wireless local area network (WLAN) 1220, a worldwide interoperability for microwave access (WI-MAX) 1130, etc. However, a structure and an interface of the electronic device 1000 are not limited thereto.

The present inventive concept may be applied to image sensors and electronic devices including the image sensors. For example, the present inventive concept may be applied to a computer, a laptop, a digital camera, a cellular phone, a smart phone, a smart pad, a tablet PC, a personal digital assistants (PDA), a portable multimedia player (PMP), a navigation system, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, modifications to the disclosed example embodiments, as well as other example embodiments, are intended to be included within the scope of the appended claims.

What is claimed is:

1. A pixel array of an image sensor comprising:
    a first pixel comprising:
        a first photoelectric conversion device configured to generate first charges responding to light incident on the first pixel;
        a first charge storage device adjacent the first photoelectric conversion device and configured to store the first charges generated by the first photoelectric conversion device;
        a first floating diffusion device adjacent the first charge storage device; and
        a first transfer gate configured to control transferring the first charges stored in the first charge storage device to the first floating diffusion device;
    a second pixel comprising:
        a second photoelectric conversion device configured to generate second charges responding to light incident on the second pixel;
        a second charge storage device adjacent the second photoelectric conversion device and configured to store the second charges generated by the second photoelectric conversion device;
        a second floating diffusion device adjacent the second charge storage device; and
        a second transfer gate configured to control transferring the second charges stored in the second charge storage device to the second floating diffusion device; and
    a storage gate on both the first charge storage device and the second charge storage device.

2. The pixel array of claim 1, further comprising:
    a storage gate control line on the storage gate and configured to transmit a storage gate control signal to the storage gate,
    wherein the storage gate extends substantially parallel to the storage gate control line.

3. The pixel array of claim 2, wherein the first pixel and the second pixel are arranged along a row direction, and
    wherein the storage gate and the storage gate control line extend in the row direction.

4. The pixel array of claim 2, wherein the first pixel and the second pixel are arranged along a column direction, and
    wherein the storage gate and the storage gate control line extend in the column direction.

5. The pixel array of claim 2, further comprising at least one contact connecting the storage gate control line to the storage gate.

6. The pixel array of claim 1, further comprising:
    a storage gate control line on the storage gate, wherein the storage gate control line is configured to transmit a storage gate control signal to the storage gate; and
    a light shielding layer between the storage gate and the storage gate control line, wherein the light shielding layer is configured to block light incident on the first charge storage device and the second charge storage device.

7. The pixel array of claim 6, further comprising at least one contact connecting the storage gate control line to the storage gate.

8. The pixel array of claim 1, further comprising:
a light shielding and storage gate control line on the storage gate, wherein the light shielding and storage gate control line is configured to transmit a storage gate control signal to the storage gate and is configured to block light incident on the first charge storage device and the second charge storage device.

9. The pixel array of claim 8, wherein the light shielding and storage gate control line is on the storage gate.

10. The pixel array of claim 8, wherein the light shielding and storage gate control line is a lowest one of a plurality of wiring layers on a substrate on which the pixel array is.

11. The pixel array of claim 1, wherein the storage gate is on a first surface of a substrate on which the pixel array is, and the pixel array further comprises:
a storage gate control line on the storage gate and configured to transmit a storage gate control signal to the storage gate; and
a light shielding layer on a second surface of the substrate opposite the first surface of the substrate and configured to block light incident on the first charge storage device and the second charge storage device.

12. The pixel array of claim 1, further comprising:
a first reset gate transistor configured to receive a reset signal to reset the first floating diffusion device responsive to the reset signal;
a first source follower configured to generate a first electrical signal corresponding to charges of the first floating diffusion device;
a first select transistor configured to transmit the first electrical signal to a first output line responsive to a selection signal;
a second reset gate transistor configured to receive a reset signal to reset the second floating diffusion device responsive to the reset signal;
a second source follower configured to generate a second electrical signal corresponding to charges of the second floating diffusion device; and
a second select transistor configured to transfer the second electrical signal to a second output line responsive to the selection signal.

13. The pixel array of claim 12, wherein the first pixel and the second pixel are arranged in a row direction,
wherein the pixel array further includes a third pixel spaced apart from the first pixel in a column direction, and
wherein the first reset gate transistor, the first source follower and the first select transistor are configured to be shared by the first pixel and the third pixel.

14. A pixel array of an image sensor comprising:
a plurality of pixels arranged in a matrix having a plurality of rows and a plurality of columns,
wherein ones of the plurality of pixels include a photoelectric conversion device, a charge storage device, a transfer gate and a floating diffusion device, and
wherein at least two pixels of the plurality of pixels corresponding to given one of the plurality of rows include a storage gate that comprises a unitary structure.

15. The pixel array of claim 14, wherein the at least two pixels of the plurality of pixels comprise a first pixel comprising a first photoelectric conversion device and a first charge storage device and a second pixel comprising a second photoelectric conversion device and a second charge storage device, and
wherein the storage gate overlaps both a space between the first photoelectric conversion device and the first charge storage device and a space between the second photoelectric conversion device and the second charge storage device in plan view.

16. An image sensor comprising:
a first pixel comprising a first photoelectric conversion device and a first charge storage device that are on a substrate, the first charge storage device being configured to store first charges generated in the first Photoelectric conversion device;
a second pixel comprising a second photoelectric conversion device and a second charge storage device that are on the substrate, the second charge storage device being configured to store second charges generated in the second photoelectric conversion device; and
a unitary storage gate configured to control transferring the first charges from the first photoelectric conversion device to the first charge storage device and the second charges from the second photoelectric conversion device to the second charge storage device.

17. The image sensor of claim 16, further comprising a storage gate control line that is configured to transmit a storage gate control signal to the unitary storage gate and extends substantially parallel to the unitary storage gate.

18. The image sensor of claim 17, further comprising a light shielding layer between the storage gate control line and the unitary storage gate, wherein the light shielding layer is on both the first charge storage device and the second charge storage device.

19. The image sensor of claim 17, further comprising a light shielding layer on a first surface of the substrate, wherein the unitary storage gate and the storage gate control line are on a second surface of the substrate opposite the first surface of the substrate.

20. The image sensor of claim 16, wherein:
the first pixel further comprises a first floating diffusion device configured to receive charges from the first charge storage device, wherein the first photoelectric conversion device, the first charge storage device and the first floating diffusion device are disposed along a first direction;
the second pixel further comprises a second floating diffusion device configured to receive charges from the second charge storage device, wherein the second photoelectric conversion device, the second charge storage device and the second floating diffusion device are disposed along the first direction; and
the unitary storage gate extends in a second direction that crosses the first direction and extends between the first photoelectric conversion device and the first floating diffusion device and between the second photoelectric conversion device and the second floating diffusion device.

* * * * *